United States Patent
Minamio et al.

(10) Patent No.: US 6,692,991 B2
(45) Date of Patent: Feb. 17, 2004

(54) RESIN-ENCAPSULATED SEMICONDUCTOR DEVICE AND METHOD FOR MANUFACTURING THE SAME

(75) Inventors: Masanori Minamio, Osaka (JP); Toru Nomura, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/230,297

(22) Filed: Aug. 29, 2002

(65) Prior Publication Data

US 2003/0102575 A1 Jun. 5, 2003

(30) Foreign Application Priority Data

Dec. 5, 2001 (JP) .......................... 2001-371243

(51) Int. Cl.$^7$ ............................................. H01L 21/44
(52) U.S. Cl. .................... 438/123; 438/111; 438/112; 438/124; 438/126; 438/127
(58) Field of Search .................... 438/110, 111, 438/112, 121, 123, 124, 125, 126, 127; 257/666, 669, 673, 676

(56) References Cited

U.S. PATENT DOCUMENTS

| | | | | |
|---|---|---|---|---|
| 5,454,905 A | * | 10/1995 | Fogelson ...................... 29/827 |
| 6,008,068 A | * | 12/1999 | Yamada ...................... 438/111 |
| 6,130,115 A | * | 10/2000 | Okumura et al. ........... 438/123 |
| 6,452,255 B1 | * | 9/2002 | Bayan et al. ................ 438/123 |
| 6,597,059 B1 | * | 7/2003 | McCann et al. ............. 257/673 |
| 6,611,047 B2 | * | 8/2003 | Hu et al. ..................... 257/666 |

FOREIGN PATENT DOCUMENTS

JP      2000-294717      10/2000

* cited by examiner

Primary Examiner—Kevin M. Picardat
(74) Attorney, Agent, or Firm—McDermott, Will & Emery

(57) ABSTRACT

The resin-encapsulated semiconductor device of the present invention includes: a die pad provided by thinning a lower portion of a lead frame; a semiconductor chip mounted on the die pad; a plurality of leads provided by thinning an upper portion of the lead frame; a connection member for connecting the semiconductor chip and the lead with each other; a plurality of suspension leads connected to the die pad; and an encapsulation resin for encapsulating an upper portion of the lead frame. In this way, it is possible to further reduce the thickness of a resin-encapsulated semiconductor device, while upsetting the die pad. Furthermore, the stress occurring from the encapsulation resin is absorbed by the self flexural deformation of the die pad and the lead, which are thinned, thereby improving the connection reliability.

4 Claims, 7 Drawing Sheets

RESIN-ENCAPSULATED SEMICONDUCTOR DEVICE AND METHOD FOR MANUFACTURING THE SAME

BACKGROUND OF THE INVENTION

The present invention relates to a resin-encapsulated semiconductor device called "QFN" (Quad Flat Non-leaded package), and a method for manufacturing the same. More particularly, the present invention relates to a resin-encapsulated semiconductor device and a method for manufacturing the same in which a lead frame is machined so as to reduce the thickness of the device and to improve the reliability thereof.

In recent years, in order to reduce the size of portable electronic devices, there is a demand for high-density mounting of semiconductor components such as resin-encapsulated semiconductor devices. Along with this trend, semiconductor packages have been reduced in size and thickness. QFN type package is known in the art as one type of resin-encapsulated semiconductor device that can meet such a demand. In a QFN type package, an outer lead, which is otherwise protruding sideways from the package, is eliminated, with external electrodes for electrical connection to the mother board being provided on the bottom surface.

A conventional QFN type resin-encapsulated semiconductor device and a method for manufacturing the same will now be described.

FIG. 6A and FIG. 6B are a cross-sectional view and a bottom view, respectively, illustrating a structure of the conventional resin-encapsulated semiconductor device, wherein FIG. 6A is a cross-sectional view taken along line VIa-VI'a-VIa in FIG. 6B.

As illustrated in FIG. 6A and FIG. 6B, the conventional resin-encapsulated semiconductor device includes a die pad 102, a semiconductor chip 101 mounted on the die pad 102 and having an electrode pad on the upper surface thereof, a plurality of leads 103 for passing electric signals to the semiconductor chip 101, thin metal wires 104 made of, for example, Au (gold) for connecting the semiconductor chip 101 and leads 103 with each other, suspension leads 108 connected to the die pad 102, and an encapsulation resin 105 for encapsulating therein the semiconductor chip 101, the thin metal wires 104 and the die pad 102. Note that the bottom surface of the conventional resin-encapsulated semiconductor device illustrated herein is in a rectangular or square shape, and the leads 103 provided along the four sides of the bottom surface are exposed on the bottom surface and the side surface of the semiconductor device. Moreover, at each corner of the bottom surface, the suspension lead 108 is exposed. The die pad 102, the lead 103 and the suspension lead 108 are made of a metal containing Cu (copper), and the thickness thereof is substantially in the range of 200 μm to 300 μm. Moreover, the thickness of the semiconductor device including the encapsulation resin is about 800 μm (0.8 mm) when the thickness of the semiconductor chip 101 is 200 μm.

As described above, the conventional resin-encapsulated semiconductor device is a lead-less type resin-encapsulated semiconductor device, in which the leads 103 exposed on the bottom surface are used as external electrodes.

Moreover, the upper surface of the die pad 102 is located higher than the upper surface of the lead 103, as illustrated in FIG. 6A, whereby the semiconductor chip 101 can overlap with the lead 103 as viewed from above, thus increasing the chip area proportion in the resin-encapsulated semiconductor device. Therefore, the conventional resin-encapsulated semiconductor device is reduced in size and thickness as compared with a QFP (Quad Flat Package) in which the leads are protruding outwards.

Next, a method for manufacturing the conventional resin-encapsulated semiconductor device will be described.

FIG. 7A to FIG. 7D are cross-sectional views illustrating a process of manufacturing the conventional resin-encapsulated semiconductor device, taken along line VIa-VII in FIG. 6B.

First, in the step shown in FIG. 7A, a lead-frame-forming metal plate made of a copper (Cu)-based material and having a thickness of 200 to 300 μm is prepared, and the metal plate is stamped or etched so as to form a lead frame including the die pad 102, semi-finished leads 103a, the suspension leads 108 for supporting the die pad 102 at their tips, and an outer frame (not shown) to which the ends of the semi-finished leads 103a and the suspension leads 108 are connected.

Then, the lead frame is pressed so as to bend the suspension leads 108 upwards, thereby upsetting the upper surface of the die pad 102 to be located higher than the upper surface of the semi-finished lead 103a. Since the pressing process requires a "grip margin", the raised portion of the suspension lead 108 is necessarily provided inside the outer frame.

Then, in the step shown in FIG. 7B, the semiconductor chip 101 is mounted on, and adhered to, the upper surface of the die pad 102 by using an adhesive such as a silver paste.

Then, in the step shown in FIG. 7C, the electrode pad of the semiconductor chip 101 mounted on the die pad 102 is electrically connected to the upper surface of the semi-finished lead 103a by using the thin metal wire 104 such as a gold wire.

Then, in the step shown in FIG. 7D, the mounted semiconductor chip 101, the die pad 102 and the thin metal wires 104 are encapsulated together with the encapsulation resin 105. In this process, the lower surface (opposing the upper surface) of the semi-finished lead 103a is left exposed.

Then, a portion of each semi-finished lead 103a connected to the outer frame of the lead frame that is protruding out of the encapsulation resin 105 is cut off, thereby forming the leads 103. Thus, the resin-encapsulated semiconductor device of a QFN type is obtained, in which the cut surface of each lead 103 is exposed on, and flush with, the side surface of the encapsulation resin 105.

When the upper surface region of the lead frame is encapsulated with the encapsulation resin 105, a sheet seal method is used, in which the resin encapsulation process is performed with a seal sheet being closely attached to the lower surface of the lead frame, thereby preventing the encapsulation resin from creeping onto the reverse surface of the lead frame. With this method, it is ensured that the lower surface of each lead is left exposed, thus realizing a one-side-encapsulated structure.

Note that in an actual manufacturing process, a plurality of resin-encapsulated semiconductor devices are formed on the same surface of a single lead frame.

In this way, the conventional resin-encapsulated semiconductor device, which are small and thin, is manufactured.

However, in the conventional resin-encapsulated semiconductor device, the upper surface of the die pad 102 is located higher than the upper surface of the lead 103, and thus the thickness of the upset is added, whereby it is difficult to further reduce the thickness thereof.

Moreover, in the conventional resin-encapsulated semiconductor device, the die pad 102 is located higher than the leads 103 by bending the suspension leads 108, whereby a bending stress is applied during the bending process to the suspension leads 108 and the die pad 102 contained in the encapsulation resin 105. Furthermore, a stress is also applied during the injection and curing of the encapsulation resin 105. Thus, the stress applied to the suspension leads 108 and the die pad 102 remains unremoved even after the resin encapsulation process, whereby the operating lifetime of the conventional resin-encapsulated semiconductor device may possibly be shortened under certain operating environments.

SUMMARY OF THE INVENTION

An object of the present invention is to provide a resin-encapsulated semiconductor device and a method for manufacturing the same, in which the thickness is further reduced and the stress applied to lead members in an encapsulation resin is reduced, thereby realizing a high reliability.

A resin-encapsulated semiconductor device of the present invention includes: a die pad provided by thinning a lower portion of a lead frame; a semiconductor chip mounted on the die pad; a plurality of leads provided by thinning an upper portion of the lead frame; a connection member for connecting the semiconductor chip and the lead with each other; a plurality of suspension leads connected to the die pad; and an encapsulation resin for encapsulating therein the die pad, the semiconductor chip, the leads, the connection member and the suspension leads, with a bottom surface and an outer side surface of each lead being exposed as an external terminal, wherein: an upper surface of the die pad is located higher than an upper surface of the lead; and a lower surface of the die pad is located higher than a lower surface of the lead.

With such a structure, the die pad and the lead are thinned while the upper surface of the die pad is located higher than the upper surface of the lead, whereby it is possible to reduce the thickness of the device while maintaining a high semiconductor chip area proportion, as compared with a conventional resin-encapsulated semiconductor device. Moreover, when the die pad and the lead are thinned to appropriate thicknesses, the stress occurring due to the resin encapsulation can be absorbed by the self flexural deformation of the die pad and the lead, thereby improving the reliability of the device.

In one embodiment of the present invention: the semiconductor chip is mounted with its principal surface facing up; and the connection member is a thin metal wire. In such a case, the resin-encapsulated semiconductor device is of a QFN type.

In one embodiment of the present invention: the semiconductor chip is mounted with its principal surface facing down; and the connection member is a bump made of a metal. In such a case, the size of the chip to be mounted can be increased as compared with a case where the connection member is a thin metal wire.

In one embodiment of the present invention, at least a portion of the semiconductor chip overlaps with the lead as viewed from above, whereby the size of the semiconductor chip to be mounted can be further increased. Thus, the semiconductor chip area proportion in the package is increased, whereby the size of the resin-encapsulated semiconductor device can be further reduced.

In one embodiment of the present invention, at least a portion of each of the die pad and the lead has a thickness of 100 $\mu$m to 150 $\mu$m, whereby the stress occurring due to the resin encapsulation can be effectively absorbed by the self flexural deformation of the die pad and the lead. Therefore, it is possible to improve the reliability of the device and to prolong the product lifetime. Moreover, the die pad and the lead are thinner than those in the prior art, whereby it is possible to reduce the thickness of the resin-encapsulated semiconductor device as a whole. Specifically, the thickness of the device can be reduced by 0.1 mm or more as compared with a conventional resin-encapsulated semiconductor device in which the thicknesses of the die pad and the lead are 200 to 300 $\mu$m.

A method of the present invention is a method for manufacturing a resin-encapsulated semiconductor device including a die pad, a semiconductor chip mounted on the die pad, a lead connected to the semiconductor chip by a connection member, and a suspension lead, the method including the steps of: (a) preparing a lead frame including the die pad, the lead and the suspension lead for supporting the die pad; and (b) thinning a lower portion of the die pad and an upper portion of the lead so that an upper surface of the die pad is located higher than an upper surface of the lead, and a lower surface of the die pad is located higher than a lower surface of the lead.

With this method, the upper surface of the die pad can be located higher than the upper surface of the lead through the step (b) of thinning the die pad and the lead. Therefore, as compared with a case where the die pad is upset by bending the suspension lead, the thickness of the device can be reduced by the thickness of the upset.

In one embodiment of the present invention, the step (b) further includes a step (b2) of thinning at least a portion of the suspension lead that is close to the die pad.

In one embodiment of the present invention, the thinning is done by a half etching process in the step (b), whereby it is possible to easily produce the structure including the die pad and the lead. Moreover, unlike in the case where a pressing process is employed, no stress is applied to the lead frame during the manufacturing process, whereby it is possible to improve the reliability of the resin-encapsulated semiconductor device to be manufactured. Moreover, when the formation of the lead frame used in the step (a) is done by an etching process, the step (b) can be performed continuously with the step (a), whereby it is possible to reduce the number of steps.

In one embodiment of the present invention, in the step (b), at least a portion of each of the die pad and the lead whose thicknesses are both 200 $\mu$m to 300 $\mu$m is thinned so that the thicknesses of the die pad and the lead are both 100 $\mu$m to 150 $\mu$m, whereby it is possible to absorb the stress occurring due to the resin encapsulation while maintaining the strength of the lead frame. Moreover, it is possible to reduce the thickness as compared with a conventional resin-encapsulated semiconductor device.

DESCRIPTION OF THE PREFERRED EMBODIMENTS

First Embodiment

A one-side-encapsulated type resin-encapsulated semiconductor device called "QFN", which is the first embodiment of the present invention will now be described with reference to the drawings.

Figure 1A:
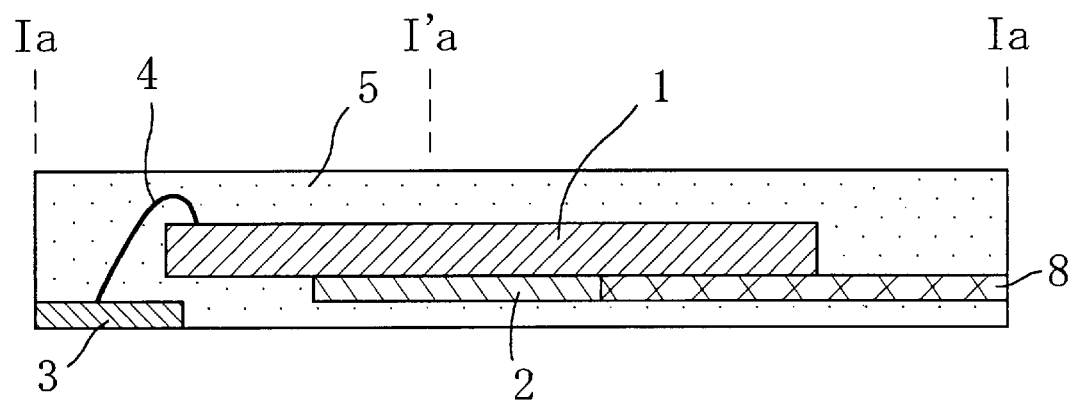
FIG. 1A and FIG. 1B are a cross-sectional view and a bottom view, respectively, illustrating a resin-encapsulated semiconductor device according to the first embodiment of the present invention.
Figure 1B:
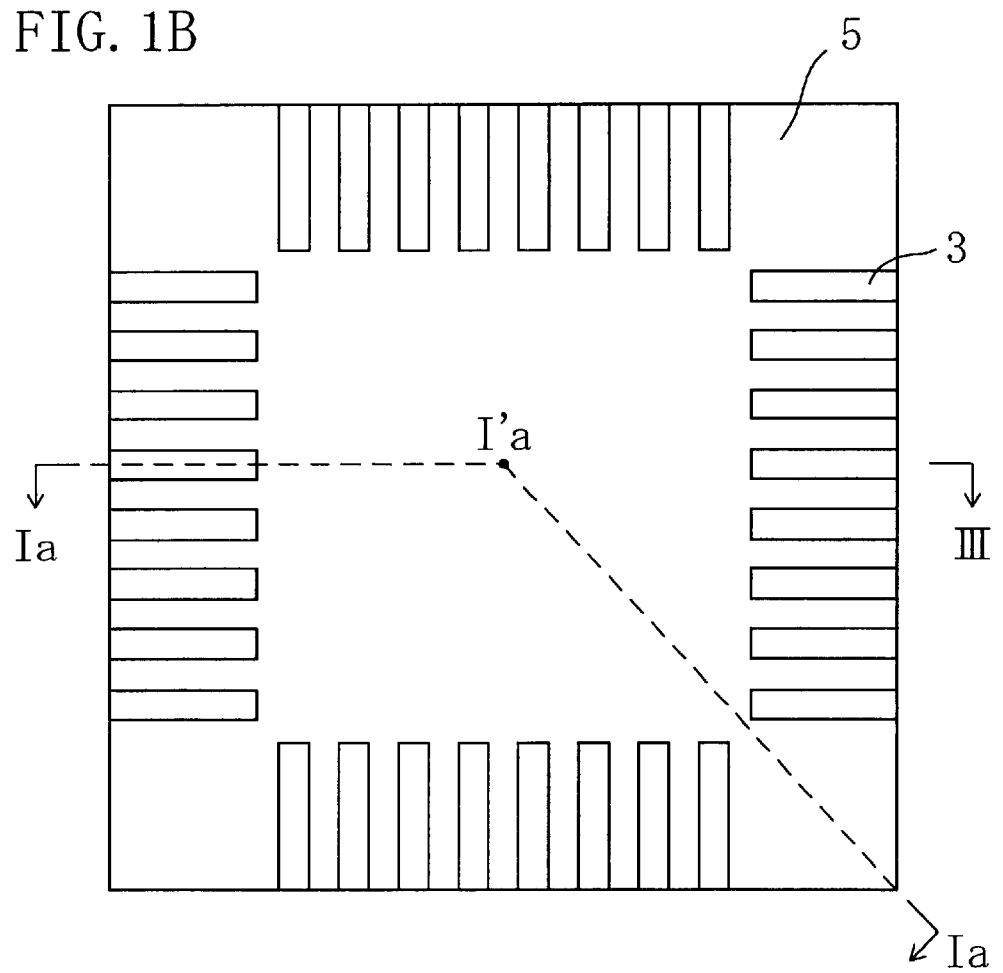

FIG. 1A and FIG. 1B are a cross-sectional view and a bottom view, respectively, illustrating a resin-encapsulated semiconductor device of the present embodiment, wherein FIG. 1A is a cross-sectional view taken along line Ia-I'a-Ia in FIG. 1B.

As can be seen from FIG. 1A, a main feature of the resin-encapsulated semiconductor device of the present embodiment is that a die pad 2, a lead 3 and a suspension lead 8 are thinned as compared with the conventional resin-encapsulated semiconductor device. Note that the term "to thin" is used in the following description to mean to reduce the thickness of a lead frame by machining the lead frame.

As illustrated in FIG. 1A and FIG. 1B, the resin-encapsulated semiconductor device of the present embodiment includes a thinned die pad 2, a semiconductor chip 1 mounted on the die pad 2 with its principal surface facing up and having an electrode pad on the upper surface thereof, a plurality of thinned leads 3 functioning as external terminals, thin metal wires 4 made of Au, for example, for connecting the semiconductor chip 1 and the leads 3 with each other, thinned suspension leads 8 connected to the die pad 2, and an encapsulation resin 5 for encapsulating therein the semiconductor chip 1, the thin metal wires 4 and the die pad 2.

Note that the bottom surface of the resin-encapsulated semiconductor device of the present embodiment illustrated herein is in a rectangular or square shape, and the leads 3 provided along the four sides of the bottom surface are exposed on the bottom surface and the side surface of the semiconductor device. The exposed bottom surface of each lead 3 may be either substantially flush with the bottom surface of the encapsulation resin 5 or protruding from the bottom surface of the encapsulation resin 5 so as to facilitate the electrical connection thereof to the mother board.

Note that in the resin-encapsulated semiconductor device of the present embodiment, unlike the conventional resin-encapsulated semiconductor device, the suspension lead 8 is not exposed at each corner of the bottom surface.

Moreover, in the resin-encapsulated semiconductor device of the present embodiment, the die pad 2, the leads 3 and the suspension leads 8 are made of a metal whose main component is copper, and have thicknesses of 100 μmm to 150 μmm, which is significantly smaller than that of the conventional device. Therefore, the thickness of the resin-encapsulated semiconductor device of the present embodiment is about 0.6 mm, which is smaller than that of the conventional device by 0.1 mm or more, where the thickness of the semiconductor chip 1 is 200 μmm.

Moreover, the lower surface of the die pad 2 is located higher than the lower surface of the lead 3. In a case where the upper portion or the lower portion of the lead frame is much thinned, the lower surface of the die pad 2 may be located higher than the upper surface of the lead 3. Therefore, the semiconductor chip mounted on the die pad 2 can overlap with the lead 3 as viewed from above, whereby the chip area proportion in the package can be increased as compared with that of QFP type devices.

The upset structure of the die pad 2 as described above is produced by etching an upper portion of the lead frame to make the die pad 2 and etching a lower portion of the lead frame to make the leads 3, as will be described later in greater detail.

Thus, according to the present embodiment, the thickness of the resin-encapsulated semiconductor device as a whole can be reduced while maintaining a high chip area proportion.

In addition, in the resin-encapsulated semiconductor device of the present embodiment, the thicknesses of the die pad 2 and the lead 3 are reduced, whereby the stress applied to the lead 3 due to the one-side-encapsulated structure is absorbed by the self flexural deformation of the lead 3. Therefore, the thin metal wire 4 connected to the lead 3 is prevented from being broken off, thus increasing the reliability of the operation as compared with the conventional device. Moreover, the suspension lead 8 is also thinned and thus has an increased amount of self flexural deformation, whereby the stress inside the encapsulation resin 5 occurring in the encapsulation step, etc., can be absorbed.

Next, a method for manufacturing the resin-encapsulated semiconductor device of the present embodiment will be described.

FIG. 3A to FIG. 3D, FIG. 4A and FIG. 4B are cross-sectional views illustrating a process of manufacturing the resin-encapsulated semiconductor device of the present embodiment, taken along line Ia-III in FIG. 1B. copper-based material, for example, and having a thickness of 200 to 300 μmm is prepared, and the metal plate is etched, for example, so as to form a lead frame including a semi-finished die pad 2a, semi-finished leads 3a, unmachined suspension leads (not shown) for supporting the die pad 2 at their tips, and an outer frame (not shown) to which the ends of the semi-finished leads 3a and the unmachined suspension leads are connected. Note that in the illustrated example, the semi-finished die pad 2a is in a square or rectangular shape, and the semi-finished leads 3a are provided along the four sides of the square or rectangular shape so as to oppose one another.

Figure 3A:
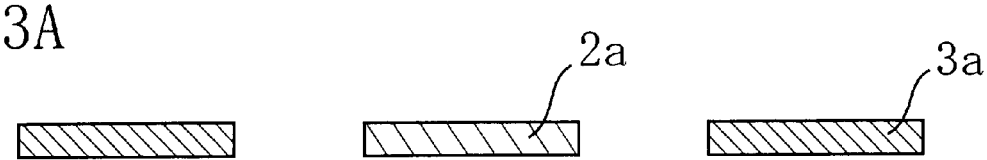
FIG. 3A to FIG. 3D are cross-sectional views illustrating a process of manufacturing the resin-encapsulated semiconductor device of the first embodiment, up to the step of providing thin metal wires.
Figure 3B:
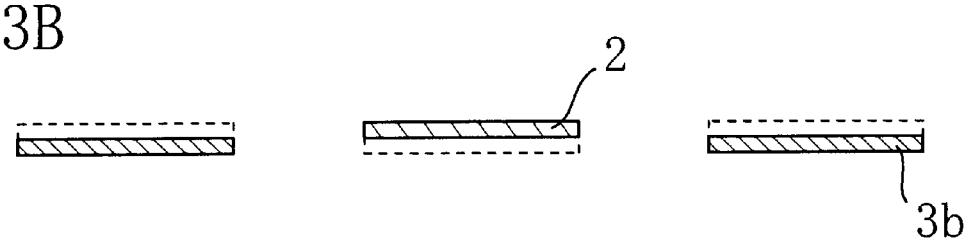

Then, in the lead frame, a lower surface region of the semi-finished die pad 2a is thinned, and an upper surface region of the semi-finished lead 3a is thinned, thereby forming the die pad 2 and uncut leads 3b, as illustrated in FIG. 3B. Each thinned portion is indicated by a dotted line in FIG. 3B.

In this way, the lead frame is formed, in which the lower surface of the die pad 2 is located higher than the lower surface of the uncut lead 3b while the upper surface of the uncut lead 3b is located lower than the upper surface of the die pad 2.

Note that although not shown in the figures, the unmachined suspension leads are also thinned at the same time as the semi-finished die pad 2a and the semi-finished leads 3a are thinned, thereby forming suspension leads. In the present embodiment, each unmachined suspension lead includes a bent-shaped portion outside the perimeter shown in FIG. 1B, and a lower portion of the unmachined suspension lead is thinned in an area that is inner than the bent-shaped portion.

The thicknesses of the die pad 2, the uncut leads 3b and the suspension leads of the lead frame are reduced to be about 100 μmm to 150 μm.

Note that while the thinning process performed in this step is preferably a half etching process by on an etching method, it may alternatively be a grinding process, a polishing process, or the like.

Then, after thinning components of the lead frame, a metal film is deposited on the surface of the lead frame as armor plating.

Figure 3C:
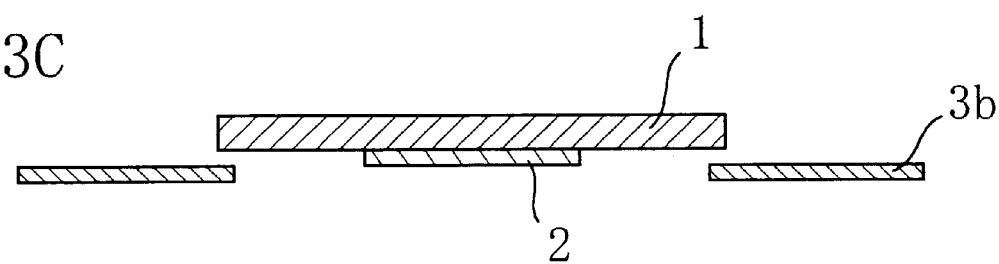

Then, in the step shown in FIG. 3C, an adhesive such as a silver paste is applied on the upper surface of the die pad 2, and the upper surface of the die pad 2 is adhered to the lower surface of the semiconductor chip 1 having electrode pads thereon. In this process, since the upper surface of the die pad 2 is located higher than the upper surface of the uncut lead 3b, the semiconductor chip 1 can overlap with the lead 3 as viewed from above, thereby increasing the chip area proportion in the package. Moreover, by adhering the bottom surface of the semiconductor chip 1 to the die pad 2 only in a central portion of the die pad 2, it is possible to improve the moisture resistance as compared with that obtained in a so-called "solid adhesive application".

Figure 3D:
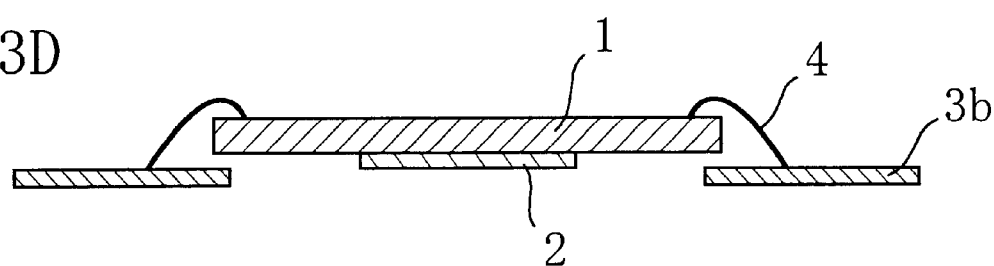

Then, in the step shown in FIG. 3D, the electrode pads of the semiconductor chip 1 and the upper surface of the uncut lead 3b are electrically connected by the thin metal wires 4. The material of the thin metal wires 4 may suitably be selected from various materials such as Au and Al.

Figure 4A:
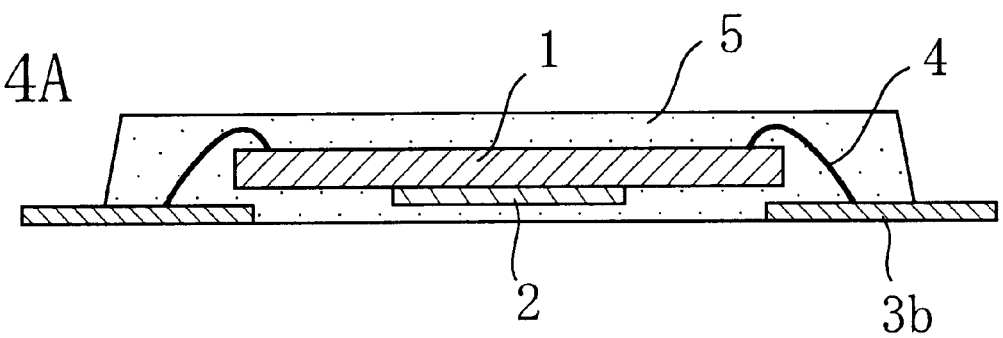
FIG. 4A and FIG. 4B are cross-sectional views illustrating the process of manufacturing the resin-encapsulated semiconductor device of the first embodiment, up to the step of forming leads.

Then, in the step shown in FIG. 4A, the semiconductor chip 1, the die pad 2 and the thin metal wires 4 are encapsulated together with the encapsulation resin 5. In this process, at least the lower surface of the uncut lead 3b is left exposed.

Note that when the upper surface region of the lead frame is encapsulated with the encapsulation resin 5, the encapsulation resin 5 is injected and cured with a seal sheet being closely attached to the lower surface of the lead frame. With this sheet sealing method, the encapsulation resin 5 is prevented from creeping onto the reverse surface of the lead frame, whereby it is ensured that the lower surface of each uncut lead 3b is left exposed, thus realizing a one-side-encapsulated structure. Note that in this step, the exposed bottom surface of each uncut lead 3b may be either substantially flush with the bottom surface of the encapsulation resin 5 or protruding from the bottom surface of the encapsulation resin 5 so as to facilitate the electrical connection thereof to the mother board.

Figure 4B:
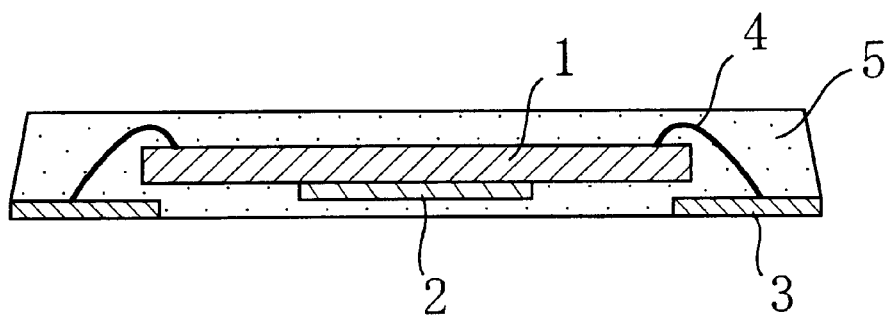

Then, in the step shown in FIG. 4B, a portion of each uncut lead 3b is cut off from the outer frame so that the cut surface is exposed substantially flush with the side surface of the encapsulation resin 5, thus forming the lead 3. In this way, the thin resin-encapsulated semiconductor device having a one-side-encapsulated structure can be obtained.

With the method for manufacturing the resin-encapsulated semiconductor device of the present embodiment, the die pad 2, the leads 3 and the suspension leads of the lead frame are thinned, whereby the upper surface of the die pad 2 can be located higher than the upper surface of the leads 3 without upsetting the die pad 2 by bending the suspension leads. Therefore, the thickness of the structure can be made smaller than that of the conventional structure by the thickness of the upset, whereby it is possible to further reduce the thickness of the package as a whole while maintaining a high chip area proportion in the package. With the method of the present embodiment, the thickness of the package as a whole can be 0.6 mm, which is smaller than that of the conventional package by 0.1 mm or more, where the semiconductor chip 1 has a thickness of 200 μmm, and the die pad 2, the leads 3 and the suspension leads of the lead frame each have a thickness of 100 μmm.

Particularly, in a case where the process of thinning the lead frame as illustrated in FIG. 3B is performed by a half etching process, the process can be performed in the same step as the process of etching the lead frame as illustrated in FIG. 3A. In this way, it is no longer necessary to separately subject the suspension leads supporting the die pad 2 to a bending and step-forming step in which a pressing process is employed, thereby simplifying the manufacturing process and reducing the manufacturing cost. Moreover, a bending stress due to a bending process, etc., is not applied to the suspension leads and the leads 3, thereby improving the reliability.

Note however that a resin-encapsulated semiconductor device viable in practical use can be manufactured by performing a polishing process, instead of an etching process.

Moreover, in the step of FIG. 3B in the method of the present embodiment, the thickness of each of the die pad 2, the lead 3 and the suspension lead is set to be about 100 μmm to 150 μm. Therefore, the stress occurring from the encapsulation resin 5 due to the one-side-encapsulated structure is absorbed by the self flexural deformation of the lead 3 and the die pad 2, whereby the thin metal wire 4 connected to the lead 3 is prevented from being broken off and the reliability can be enhanced.

Note however that with a lead frame used in the present embodiment whose main component is copper, the strength of the suspension lead 8 may be insufficient when the thickness thereof is less than 50 μmm, in which case the suspension lead 8 may not be able to endure the weight of the die pad 2 or the stress applied thereto during the manufacturing process. On the other hand, when the thicknesses of the die pad 2 and the lead 3 are greater than 150 μmm, it is then difficult to realize the advantageous stress absorption. Therefore, it is generally preferred that the thickness of each of the die pad 2, the lead 3 and the suspension lead 8 is 50 μmm to 150 μmm, and more preferably 100 μmm to 150 μm. Note that the preferred thickness ranges do not substantially change even when using a material other than Cu-based materials for the lead frame.

Note that while it is preferred that the thickness of a portion of the suspension lead that is connected to the die pad 2 is 100 μm to 150 μmm, the remaining portion may not have to be thinned. Moreover, the thickness of the die pad 2 or the lead 3 does not need to be in the range of 100 μmm to 150 μmm across the entirety thereof, but the thickness may partially be greater than 150 μmm. Even in such a case, the stress applied during the manufacturing process can be absorbed.

Note that in the step shown in FIG. 3B, a lower surface of a tip portion of the semi-finished lead 3a may be thinned to form a stepped portion, while thinning an upper surface region of the semi-finished lead 3a. In this way, moisture is better prevented from entering the encapsulation resin 5, thereby improving the moisture resistance and thus the reliability of the device.

Moreover, in the resin-encapsulated semiconductor device of the present embodiment, an end portion of the semiconductor chip 1 partially overlaps with the lead 3 as viewed from above. However, there may alternatively be no such overlap.

Note that in the resin-encapsulated semiconductor device of the present embodiment, the thin metal wire 4 is used for the connection between the lead 3 and the electrode pad of the semiconductor chip 1. Alternatively, a bump made of a conductor may be used. In this way, it is possible to produce a flip chip that is thinner than those in the prior art, and it is also possible to further increase the size of the semiconductor chip to be mounted. In such a case, the semiconductor chip is mounted on the die pad with its principal surface facing down, and the semiconductor chip is connected with bumps provided on the leads.

Note that the present embodiment has been directed to an example where only one layer of semiconductor chip is included in a package. Alternatively, a plurality of semiconductor chips stacked on one another may be encapsulated in a single package. In such a case, the semiconductor chip in an upper layer is connected, for example, to the leads in the lowermost layer or to the semiconductor chip in the next lower layer, via thin metal wires, or the like. By using the method of the present embodiment, it is possible to manufacture a so-called "wire-stacked" resin-encapsulated semiconductor device that is thinner than those in the prior art.

Moreover, a plurality of packages each including one semiconductor chip may be stacked on one another. be stacked on one another.

Figure 2A:
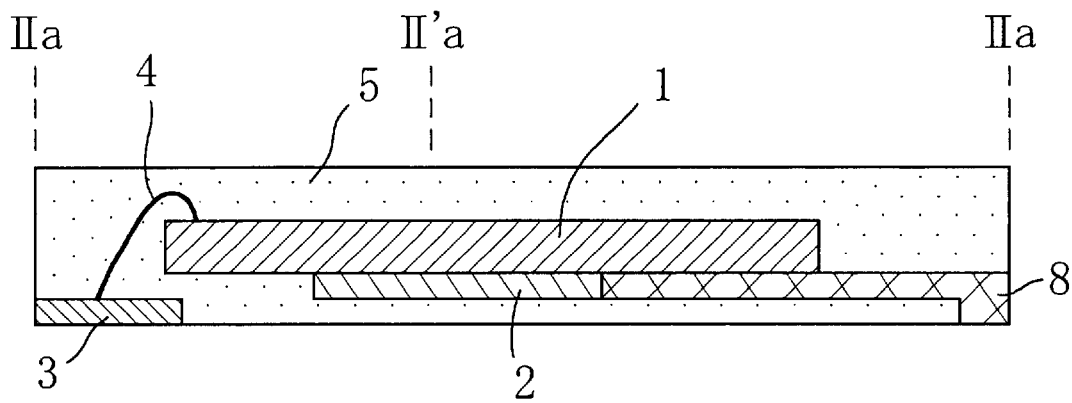
FIG. 2A and FIG. 2B are a cross-sectional view and a bottom view, respectively, illustrating a variation of the semiconductor device of the first embodiment.
Figure 2B:
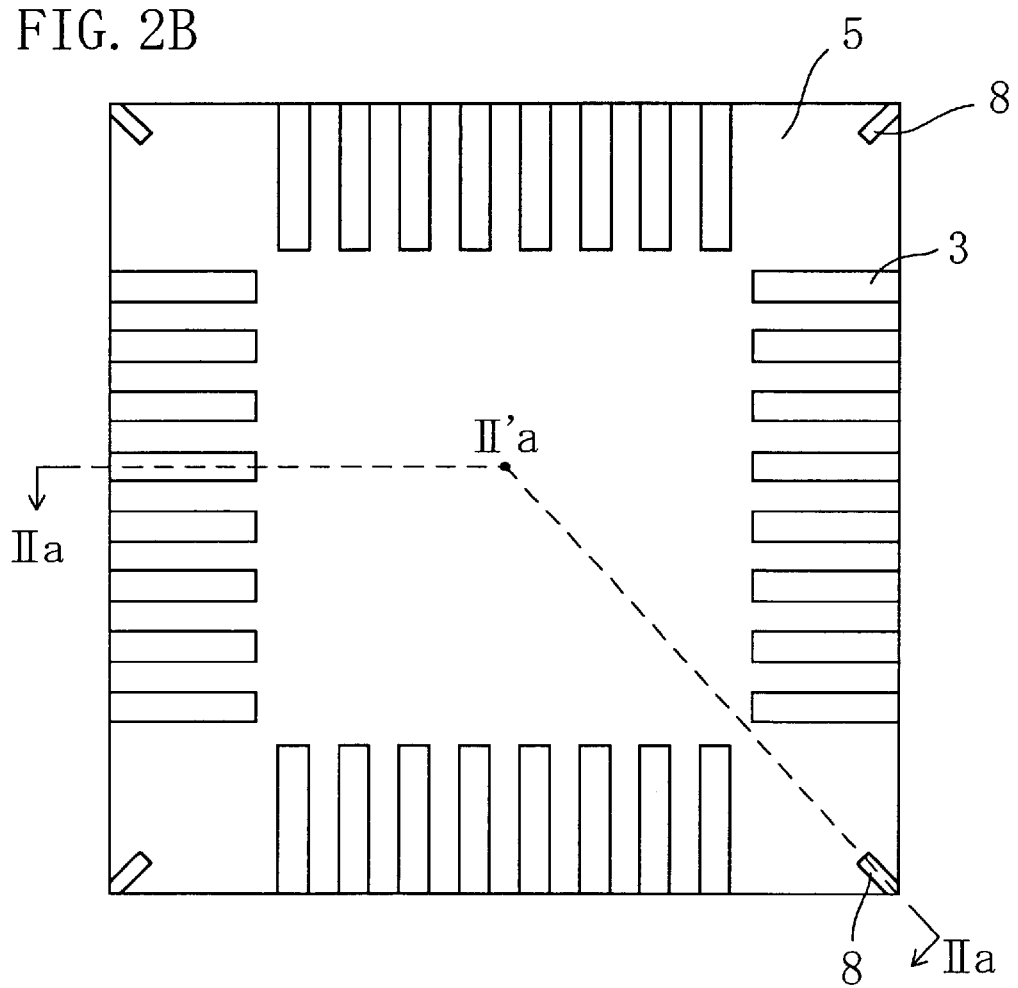

Moreover, FIG. 2A and FIG. 2B are a cross-sectional view and a bottom view, respectively, illustrating a variation of the semiconductor device of the present embodiment, wherein FIG. 2A is a cross-sectional view taken along line IIa-II'a-IIa in FIG. 2B.

As illustrated in the figures, a bent-shaped portion of the suspension lead 8 is exposed at each corner of the bottom surface in the present variation. Thus, with the method of the present embodiment, the position of the bent-shaped portion is not limited to any particular position as long as it is outside the die pad 2. Note however that when a pressing process is performed, a "grip margin" is required and thus the bent-shaped portion of the suspension lead 8 will necessarily be exposed.

Second Embodiment

A method for manufacturing a resin-encapsulated semiconductor device according to the second embodiment of the present invention will be described. Note that the present embodiment is a method for manufacturing the resin-encapsulated semiconductor device of the first embodiment by using a bulk formation method. Herein, the bulk formation means batch sealing of a plurality of semiconductor chips boarded on the lead frame.

Figure 5A:
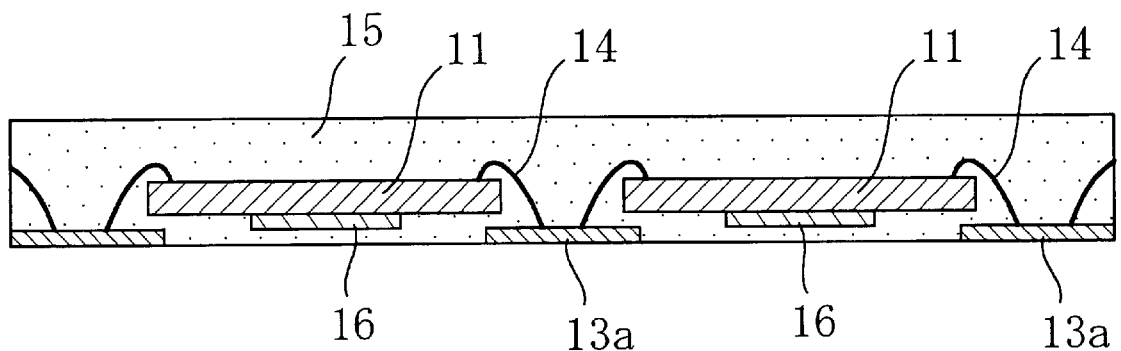
FIG. 5A to FIG. 5C are cross-sectional views illustrating a process of manufacturing a resin-encapsulated semiconductor device according to the second embodiment of the present invention, up to the resin cutting step.
Figure 5B:
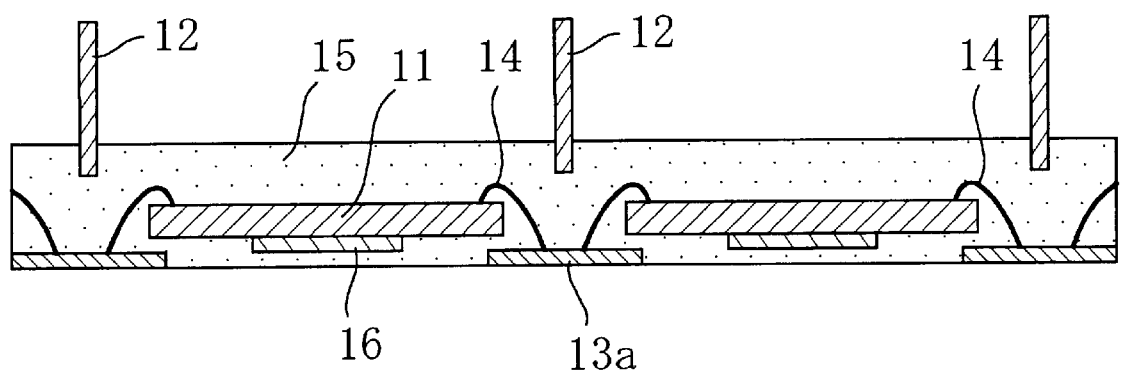
Figure 5C:
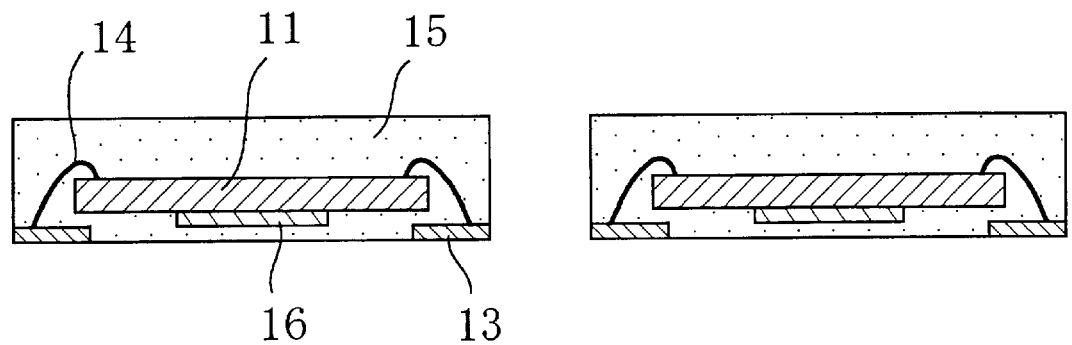
Figure 6A:
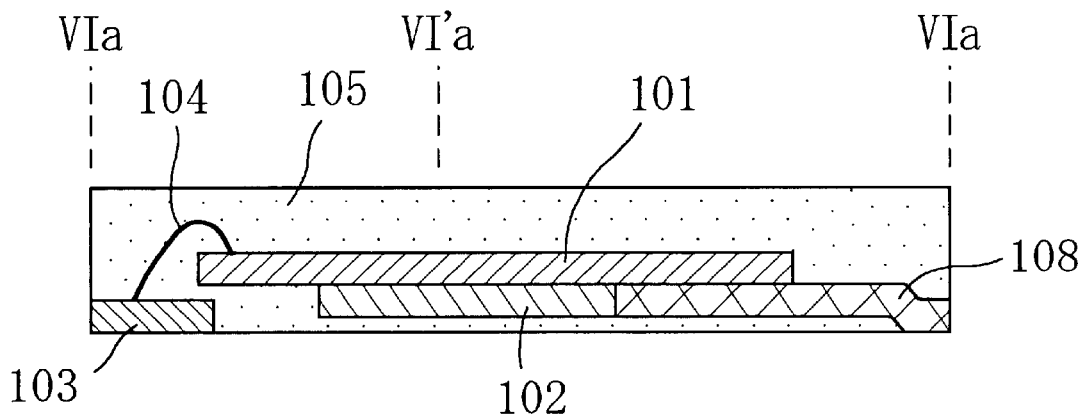
FIG. 6A and FIG. 6B are a cross-sectional view and a bottom view, respectively, illustrating a conventional resin-encapsulated semiconductor device.
Figure 6B:
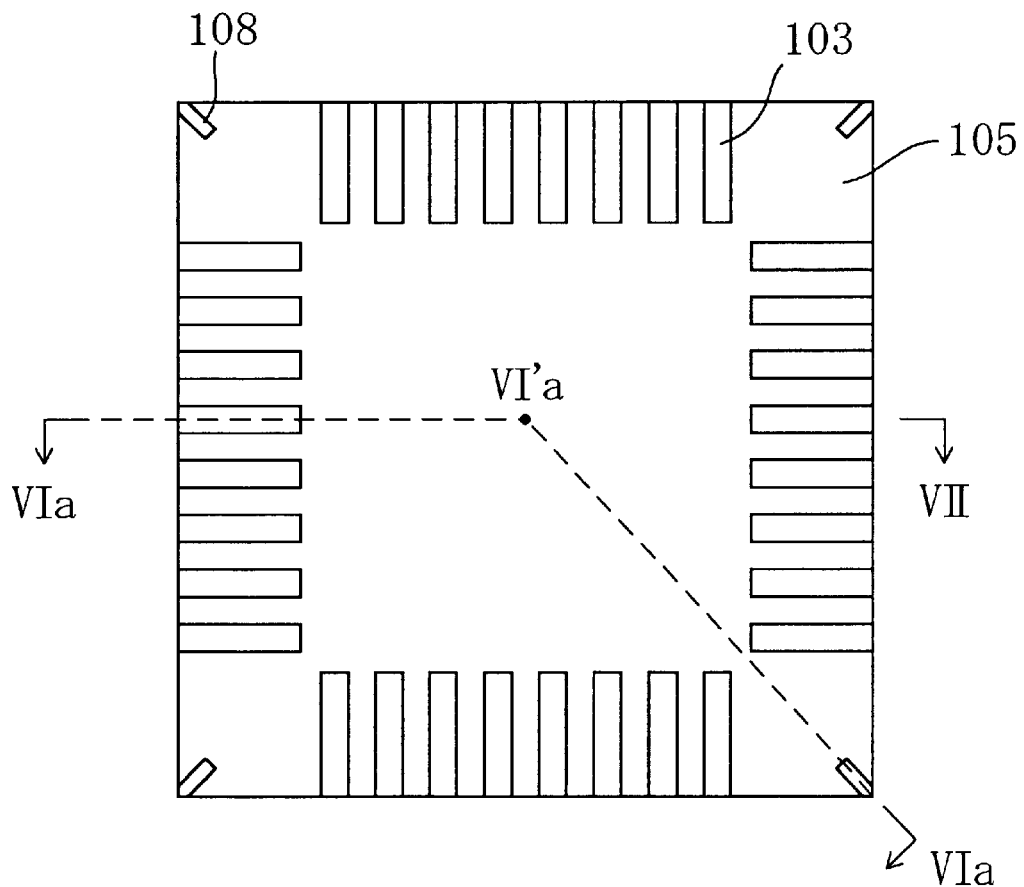
Figure 7A:
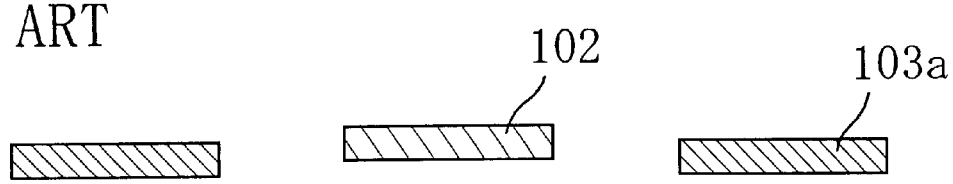
FIG. 7A to FIG. 7D are cross-sectional views illustrating a process of manufacturing the conventional resin-encapsulated semiconductor device.
Figure 7B:
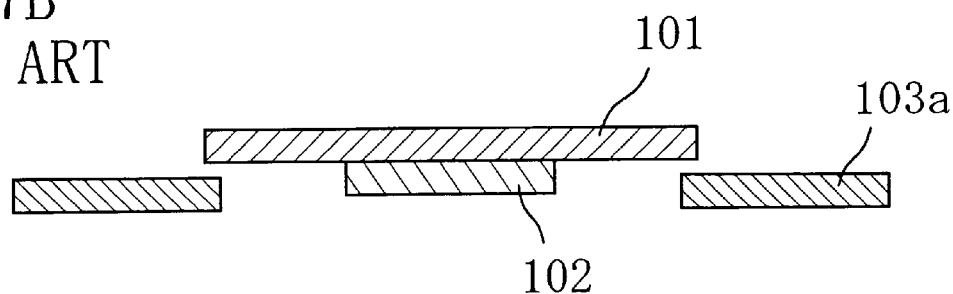
Figure 7C:
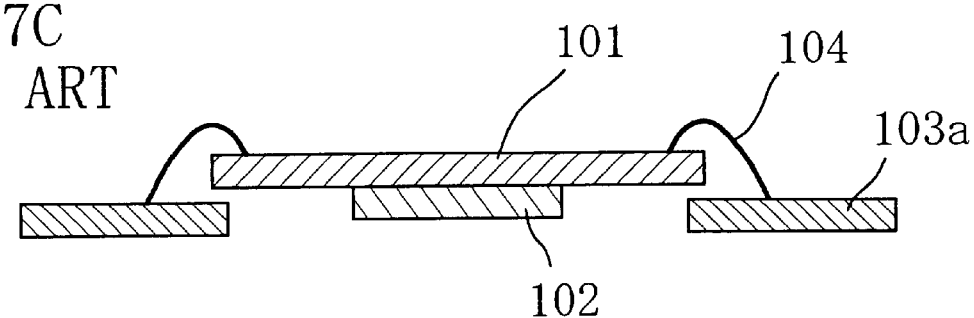
Figure 7D:
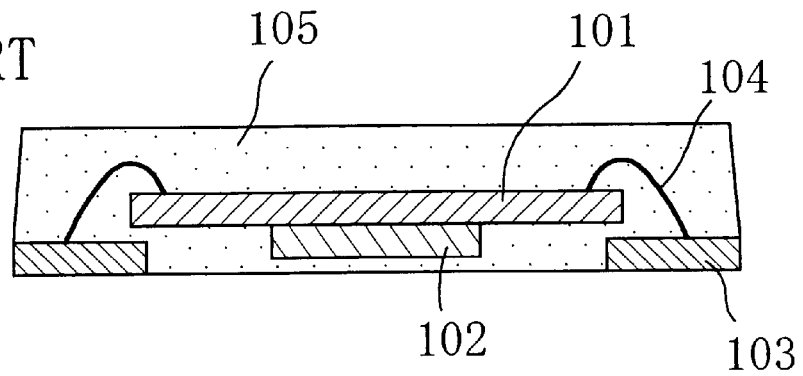

FIG. 5A to FIG. 5C are cross-sectional views illustrating a part of the method for manufacturing a resin-encapsulated semiconductor device of the present embodiment, from the resin encapsulation step up to the resin cutting step.

First, in the step shown in FIG. 5A, members are thinned by, for example, a half etching process as in the first embodiment to form a lead frame including die pads 16, uncut leads 13a and suspension leads. In this process, the lead frame is formed so that the upper surface of the die pad 16 is located higher than the upper surface of the uncut lead 13a. Note that the die pads 16, the uncut leads 13a and the suspension leads each have a thickness of 100 μm to 150 μm.

Note that the present embodiment is different from the first embodiment in that a plurality of outer frames are provided for one lead frame.

Then, a semiconductor chip 11 having electrode pads thereon is mounted on each die pad 16, after which the electrode pads and the uncut leads 13a are connected to each other via thin metal wires 14. In this process, two thin metal wires 14, which are connected respectively to two adjacent semiconductor chips 11, are connected to one uncut lead 13a. Note that although not shown, a dambar is provided between the two thin metal wires 14.

Then, the semiconductor chips 11, the die pads 16 and the thin metal wires 14 are encapsulated together with an encapsulation resin 15. In the present embodiment, a lead frame for bulk formation is used, in which each uncut lead 13a extends continuously across the boundary between adjacent portions to be individual devices. Accordingly, the encapsulation resin 15 is injected in a single operation for the entire lead frame.

Then, in the step shown in FIG. 5B, the intermediate structure is cut along the boundaries of the uncut leads 13a into individual devices by using a rotating blade 12 such as a dicing blade.

Then, in the step shown in FIG. 5C, the cutting operation is completed, and individual resin-encapsulated semiconductor devices are obtained.

With the method for manufacturing a resin-encapsulated semiconductor device of the present embodiment, as compared with a method in which the individual resin-encapsulated semiconductor devices are formed one by one, a plurality of devices can be manufactured at once, thereby considerably increasing the production efficiency. Moreover, the semiconductor chips 11 are encapsulated together at once in a bulk formation process and then cut into individual devices by using the rotating blade 12, with an appropriate amount of cut margin being provided according to the size of the semiconductor chip 11, whereby it is not necessary to replace a mold for each semiconductor chip.

As described above, by using the method of the present embodiment, the resin-encapsulated semiconductor device of the first embodiment can be manufactured with a very good efficiency.

Particularly, in the manufacturing method of the present embodiment, the thickness of the uncut lead 13a to be cut by a blade is reduced by a half etching process, whereby it is possible to reduce the load on the rotating blade 12 and to prevent the generation of a burr from the metal material of the lead 13. Therefore, the cutting operation can be performed more effectively, whereby the production efficiency can be improved.

Note that while the rotating blade 12 is passed through the intermediate structure from the side of the encapsulation resin 15 in the cutting step shown in FIG. 5B in the manufacturing method of the present embodiment, the rotating blade 12 may alternatively be passed through the intermediate structure from the side of the lower surface of the lead 13.

Moreover, with the manufacturing method of the present embodiment, a resin-encapsulated semiconductor device, in which a lower surface of a tip portion of the lead is thinned to form a stepped portion, can be manufactured as in the first embodiment.

Moreover, with the manufacturing method of the present embodiment, metal bumps may be used instead of the thin metal wires 14, or a plurality of semiconductor chips may be stacked on one another.

What is claimed is:

1. A method for manufacturing a resin-encapsulated semiconductor device including a die pad, a semiconductor chip mounted on the die pad, a lead connected to the semiconductor chip by a connection member, and a suspension lead, the method comprising the steps of:

(a) preparing a lead frame including the die pad, the lead and the suspension lead for supporting the die pad; and (b) thinning a lower portion of the die pad and an upper portion of the lead so that an upper surface of the die pad is located higher than an upper surface of the lead, and a lower surface of the die pad is located higher than a lower surface of the lead.

2. The method for manufacturing a resin-encapsulated semiconductor device of claim 1, wherein the step (b) further includes a step (b2) of thinning at least a portion of the suspension lead that is close to the die pad.

3. The method for manufacturing a resin-encapsulated semiconductor device of claim 1, wherein in the step (b), the lower portion of the die pad and the upper portion of the lead are thinned by a half etching process.

4. The method for manufacturing a resin-encapsulated semiconductor device of claim 1, wherein in the step (b), at least a portion of each of the die pad and the lead whose thicknesses are both 200 $\mu$mm to 300 $\mu$mm is thinned so that the thicknesses of the die pad and the lead are both 100 $\mu$mm to 150 $\mu$mm.

* * * * *